United States Patent

Burth et al.

[11] Patent Number: 5,434,421
[45] Date of Patent: Jul. 18, 1995

[54] PROCESS AND DEVICE FOR TREATING PARTICULATE MATERIAL WQITH ELECTRON BEAMS

[75] Inventors: Ulrich Burth, Kleinmachnow; Siegfried Panzer, Dresden; Joerg Schmidt, Dresden; Siegfried Schiller, Dresden; Gerhard Kuehn, Dresden; Kerstin Lindner, Potsdam; Joachim Pflaumbaum, Blankenburg; Friederun Scholze, Quedlinburg; Klaus Gaber, Dresden; Harald Ellert, Schoenebeck/Elbe; Thomas Scholze, Dresden; Joerg Greilich, Magdeburg, all of Germany

[73] Assignee: Gesellschaft fuer Unweltschutzberatung und -technik Gbr, Quedlinburg, Germany

[21] Appl. No.: 916,122
[22] PCT Filed: Jan. 31, 1991
[86] PCT No.: PCT/EP91/00182
§ 371 Date: Sep. 30, 1992
§ 102(e) Date: Sep. 30, 1992
[87] PCT Pub. No.: WO91/11096
PCT Pub. Date: Aug. 8, 1991

[30] Foreign Application Priority Data

Jan. 31, 1990 [DE] Germany .............................. 3374158
Jan. 31, 1990 [DE] Germany .............................. 3374166

[51] Int. Cl.6 ............................................. H01J 37/30
[52] U.S. Cl. .................................. 250/434; 250/492.3
[58] Field of Search .................. 250/492.3, 436, 434; 47/1.3

[56] References Cited

U.S. PATENT DOCUMENTS

| | | |
|---|---|---|
| 2,333,842 | 11/1943 | Cascio . |
| 3,711,709 | 1/1973 | Rudolf ............................. 250/436 |
| 3,901,807 | 8/1975 | Trump . |
| 3,932,760 | 1/1976 | Inoue ............................. 250/492.3 |
| 4,048,504 | 9/1977 | Bosshard ......................... 250/434 |
| 4,492,872 | 1/1985 | Dmitriev et al. .................. 250/492.3 |
| 4,633,611 | 1/1987 | Schiller et al. ................... 47/1.3 |
| 4,915,916 | 4/1990 | Ito et al. .......................... 250/492.3 |
| 5,175,436 | 12/1952 | Puumalaimen .................. 250/492.3 |

FOREIGN PATENT DOCUMENTS

| | | |
|---|---|---|
| 961079 | 5/1950 | France . |
| 1239060 | of 1960 | France . |
| 2025147 | 9/1970 | France . |
| 242337 | 1/1987 | German Dem. Rep. . |
| 238715 | 9/1986 | Germany . |
| 908581 | 10/1962 | United Kingdom . |

*Primary Examiner*—Bruce C. Anderson
*Attorney, Agent, or Firm*—Birch, Stewart, Kolasch and Birch

[57] ABSTRACT

Process and device for electron beam treatment of bulk material where the bulk material is fed into a continuous stream by means of compression stages (3) which can be evacuated. It is dispersed and directed into a dosed irradiation chamber (1), passing in this chamber through an irradiation field in a free-fall process, and discharged from the irradiation chamber through a compression stage system (4). The invention enables electron beam treatment of biological materials to be carried out to particularly good advantage, e.g. in combatting harmful organisms in seeds.

17 Claims, 3 Drawing Sheets

PROCESS AND DEVICE FOR TREATING PARTICULATE MATERIAL WQITH ELECTRON BEAMS

DESCRIPTION

The present invention relates to a process for treating bulk material in particulate form, in particular seeds, with electron beams within an irradiation field of an irradiation chamber through which the bulk material is moved and subjected to an electron beam treatment with a plurality of electron beams and from which it is subsequently discharged, and to a device for such a treatment. The invention relates, in particular, to a process for treating grainy, moist or dusty particulate material or bulk material with electron beams in vacuum. Preferably, the process and the device serve to treat seeds, in particular grains, which are subjected to dressing with electron beams to render the pathogens ineffective that adhere to these seeds.

BACKGROUND OF THE INVENTION

It is known that seeds are irradiated on all sides with low energy electrons. Electron energy and radiation dose are chosen such that the surface and near-surface layer are acted upon without any substantial impairment of the embryo (DD-PS 242 337). A device is here known which constantly redistributes the seeds with the aid of moving means within a recipient, with the seeds being acted upon by a deflected and fanned electron beam. Transporting devices which serve to supply and discharge the seeds and include the associated feeders are connected to the recipient (U.S. Pat. No. 4,633,611).

Since especially with seeds a relatively great amount of water is bound to and in the surface of seeds, the water evaporation rate is very high at the vacuum required in the irradiation chamber. This fact can only be counteracted by taking great evacuation efforts. Moreover, the process as well as the device have the disadvantage that an industrial application which calls for a great throughput is not possible because of the great dust portion of the seeds. The long-term operation of the electron gun is affected by this great dust development in the irradiation chamber.

Irradiation devices in the case of which the bulk material is guided in a free atmosphere are also known (U.S. Pat. No. 860,513 and 2,333,842). These devices are not suited for effecting any action on the surface or the near-surface layer of the bulk material exactly in the prescribed depth; in particular, phytotoxic effects on the seeds may occur because of the resultant energy dispersion.

FR-PS 961 079 discloses an irradiation device which has electron beam generators arranged opposite to each other on an irradiation chamber and in the case of which the material to be irradiated is introduced from above into the irradiation chamber and discharged therefrom downwards. Such a device, however, does not create the preconditions for an adequately individual irradiation of grainy bulk material, such as seeds, for dressing said material.

It was discovered during the conduction of the process with the known technological electron beam devices and the known bulk material delivery devices that relatively constant surface doses can only be achieved at a small bulk material throughput. By contrast, all attempts have failed to achieve a uniform surface dose as is required by the process, as well as a high utilization degree of the electron beam and a high mass throughput with the device at the same time. In other words, evacuation problems which can no longer be solved technically arise from other delivery principles that have accomplished this uniformity. However, the solution of both problems is an absolutely necessary precondition for an industrial utilization of the process.

SUMMARY OF THE INVENTION

It is therefore the object of the present invention to improve a process of the above-mentioned type in such a way that the bulk material in particulate form is irradiated with electrons such that a high throughput is possible at small dwell times within the recipient. The process is above all suited for bulk material in particulate form, such as seeds, with a relatively high water and/or dust content.

It is also the object of the present invention to provide a device for treating bulk material in particulate form, in particular grain, with electron beams, namely a device for irradiating the particulate material by electron beams on all sides and as uniformly as possible, with the apparatus needed being as small as possible, and also for treating materials which have a relatively high water and/or dust content.

As far as the process is concerned, the above-mentioned object is attained according to the invention in that the bulk material is moved in a free-fall process through the evacuated irradiation chamber in dosed amounts and separated at an inlet side of the evacuated chamber for forming a continuous material flow of separated particulate material, the electron beams are spread in the direction of fall of the material and the separated particulate material is irradiated in the irradiation field on substantially all sides by the spread electron beams from several sides and different directions.

Hence, a material flow is formed from the particulate material and said flow is moved through the evacuated irradiation chamber in which said material flow is guided in a free-fall process through at least one irradiation field of the irradiation chamber, with the distance between the particles being increased within the material flow, subjected to an electron beam treatment in the irradiation field and subsequently guided out of the irradiation chamber.

Preferably, the particulate material is supplied via at least one pressure stage to the irradiation chamber and discharged via at least one further pressure stage out of the irradiation chamber.

It is here preferred that the particulate material or bulk material is controlled prior to its introduction and after its discharge from the irradiation chamber, preferably in front of and after a respective pressure stage for introducing and discharging bulk material, optionally also in the irradiation chamber itself, in such a way that a column of particulate material or bulk material is formed which has a great height or axial extension in comparison with its diameter and acts as a flow resistance.

To keep the critical release of degasification products or moisture and/or dust from the particulate material or bulk material as small as possible with respect to the evacuation degree in the recipient and with respect to a long, trouble-free operation of the electron beam generators used for electron treatment, it is preferred that the particulate material or bulk material is transported during the stepwise pressure transition from atmospheric pressure to internal pressure in an evacuated irradiation chamber (recipient) in such a way that the amount of gases (water vapour) and dust sucked off by evacuation at each pressure stage is as small as possible. Therefore, the internal pressure is preferably adjusted at the pressure stages such that the vapour pressure of water is not fallen below.

To achieve a uniform irradiation of the particles of the material flow or bulk material flow, it is ensured that the particles pass through the irradiation field at least at about the same particle speed.

To achieve a dosage distribution which is as uniform as possible on the surface of the irradiated particle material, e.g. of seeds, the material is exposed in the irradiation field of the irradiation chamber to electron beams which are fanned over a very large width, and is acted upon along a path which begins above the exit point of the electron beam from an electron beam generator and ends below the same. This means that each particle, e.g. seed, is preferably subjected during its free fall in the irradiation chamber within the irradiation field to an electron irradiation which is directed from obliquely upwards to obliquely downwards relative to the electron beam generator. As a result, each particle is acted upon during its free fall for a relatively long time and at least approximately from all sides.

It is preferred that the current density profile of the irradiation field is configured in vertical direction, i.e. in the direction of fall of the particulate material or the bulk material flow in such a way that the surface dose of the material, e.g. of seeds, is substantially evenly distributed. A current density profile may here be used for each electron beam generator which has two regions of a high current density that are acted upon over the entire width of the material flow in a sufficiently uniform way and are generated by a region of small current density or entirely absent actuation, with the current density profile of the electron beams used being optimized such that the particles passing through this irradiation field, e.g. seeds, receive a sufficiently homogeneous dosage distribution over their surface.

As another measure for homogenizing the surface dose on the irradiated particulate material, an evacuation or working pressure is adjusted in the irradiation chamber to lie between about 10 Pa and some 100 Pa, preferably from about 100 Pa to several 100 Pa, whereby an angular scatter of the accelerated electrons is achieved without any objectionable energy losses.

The line frequency of the electron beam is preferably at several kHz and the picture frequency within the range of some 10 kHz to some 100 kHZ. Electron beam power losses due to a long optical path up to the plane of the material flow of the particulate material or bulk material flow, blanking as well as other influences can be compensated by this programmability of the deflection function in an advantageous way.

An especially preferred embodiment of the process for treating bulk material with electron beams, in particular for treating seeds against harmful organisms, is characterized in that the bulk material is introduced into and discharged from an evacuated irradiation chamber via pressure stages, with a minimum pressure that corresponds at least to the vapour pressure of a liquid, in particular water, in the near surface layers and on the surface of the bulk material prevailing at each pressure stage for the introduction of the bulk material, and the sucking off of gases, in particular water vapour, and dust being minimized, and that, after having passed through the pressure stages, the bulk material moves through the irradiation chamber in a free-fall process at approximately the same individual speed of the particles of the bulk material, the particles being separated at a transparency in the irradiation region of about 50% and at a mean particle distance in a direction transverse to the flow direction of the bulk material which is greater than the particle size, and is acted upon by a plurality of fanned electron beams on several sides from obliquely upwards to obliquely downwards relative to the electron beam generation, with the electron beam generation being carried out with two electron guns in a radially opposite arrangement relative to the bulk material flow.

In accordance with another embodiment of the present invention the combination of the following steps has turned out to be of special advantage to an electron beam treatment of the particulate material or bulk material, in particular for combating harmful organisms on grains. The bulk material is transported in the irradiation chamber during stepwise pressure transition from atmospheric pressure to evacuation pressure or working pressure in such a way that as little gases (water vapour) and dust as possible are sucked off by evacuation at each pressure stage. The pressure at the pressure stages is adjusted such that the vapour pressure of water is not fallen below. The pressure in the irradiation chamber is preferably kept within a range between 100 Pa and some 100 Pa. After having passed through the pressure stages, the bulk material moves in a free fall at approximately the same individual speed of the particles of the bulk material flow, e.g. seeds or grains, through the irradiation chamber and is acted upon by a plurality of fanned electron beams. The particles are separated in the material or bulk material flow in such a way that the transparency in the irradiation range is about 50% and the mean distance between the particles in a cross-sectional plane of the irradiation chamber is greater than their size (outer dimension). In this region the electron beams from electron guns act on the particles at least on two sides and preferably at about the same time. The electron beams are fanned over a very great width and therefore act on the particles on several sides along the flow path of said particles, i.e. from obliquely upwards to obliquely downwards with respect to the electron beam generator. As a result, each particle is irradiated in a free-fall process from a point obliquely above the electron source to obliquely below said source and is acted upon approximately from four sides in view of the two-dimensional fanning of the electron beams. Since a particle, e.g. grain, has a movement of its own when falling through the irradiation region, the surface of the particles is acted upon with electron beams on all sides in this way and the surface dose is distributed in a substantially homogeneous way.

The evacuation process of the electron beam generator (electron gun) and of the irradiation chamber is carried out such that air flows are always directed from the electron gun to the irradiation chamber or always from the electron beam generator and the irradiation chamber to the side of atmospheric pressure when the irradiation chamber and the electron beam generator connected thereto are pumped and aerated.

The fast passage of the particulate material or bulk material from the pressure stage feeder which is arranged at the inlet side of the irradiation chamber and in which a pressure prevails above that of the water bound in the surface of the material to be treated, e.g. grains, into the irradiation chamber at a substantially lower working pressure, as well as the short dwell time in the irradiation chamber effect a sudden temperature decrease on the surface of the particulate material or bulk material and thus a reduction of the evaporation rate of water.

The above object is attained according to the invention with respect to the device for treating bulk material in particulate form, in particular seeds, with electron beams in a vertically arranged irradiation chamber which includes a top inlet opening and a bottom outlet opening for the bulk material and on which a plurality of electron beam generators are radially arranged, by the measures that the irradiation chamber is evacuated and its upper end is provided with a distributing device for separating the particulate material, and the electron beam generators are equipped with deflection means for spreading the electron beams to form an irradiation field through which the particulate material exiting from the distributing device is moved in a free-fall process.

Hence, the evacuated irradation chamber is provided for receiving a material flow of particulate material in a free-fall process, with the particle distance being increased in at least one irradiation field of the irradiation chamber, and that electron beam generators are arranged radially relative to the material flow in the area of the irradiation field and equipped with deflection means for spreading the irradiation field swept over by the electron beams from several directions.

It is preferred that at least two electron guns are arranged on the irradiation chamber, preferably diametrally opposite to each other.

An adequate irradiation of the particulate material on all sides effects an adequate separation of the material flow or bulk material flow of particulate material during passage through the irradiation field inside the irradiation chamber. To this end, a distribution device is preferably arranged at the entry point of the particulate material or bulk material into the irradiation chamber for separating the material across substantially the whole cross-section, namely at least in parallel with a main plane of the irradiation chamber and preferably together with a fall shaft arranged thereafter. An improved separation of the particles of the material or bulk material flow is also achieved by providing the irradiation chamber with a sufficient length in vertical arrangement, so that the particles of the material or bulk material flow are sufficiently separated in the irradiation region.

Furthermore, it is preferred that a pressure-stage feeder system for the introduction and discharge of the particulate material or bulk material into and from the irradiation chamber (recipient) has pressure stages which are composed of a plurality of rotary vane feeders, at least the rotary vane feeder closest to the inlet and outlet sides of the irradiation chamber being each speed-controlled and also active as a dosage device.

Preferably, in the device according to a preferred embodiment of the invention, the transport of the particulate material or bulk material is controlled before and after the respectively last pressure stage for the introduction and discharge of said material in such a way that a column of particulate material or bulk material is maintained whose axial extension, i.e. the height, is great in comparison with its diameter. This column acts as a flow resistance.

To avoid or suppress disadvantageous effects on the electron guns by substances which accompany the particulate material or bulk material and are introduced together with the material into the irradiation chamber, the guns are provided in the beam generator with a plurality of successive shutters whose diameter is adapted to the associated electron beam, preferably increases towards the beam exit side when fanned electron beams are used. Vacuum generators are radially connected between adjacent shutters. It is also preferred that an aeration connection which can be throttled is provided between the two shutters closest to the beam exit of the electron beam from the associated electron gun.

In a preferred embodiment of the device according to the present invention, a distribution device which evenly distributes the material or bulk material with the aid of guide plates substantially over the whole cross-section (at least in the direction of a main plane) of a fall shaft arranged directly after the distribution device is provided at the entry point of the particulate material or bulk material, such as grains, into the irradiation chamber. At least two electron beam generators (electron guns), preferably axial guns, are preferably arranged at the same level radially opposite to each other in the irradiation region arranged after the fall shaft. The associated deflection means of the electron guns fan the respectively associated electron beam over a great width. Each electron beam is periodically deflected in the conventional way by means of deflection generators horizontally and vertically. The electron guns have a plurality of shutters whose diameter is adapted for guiding the electron beam in the electron gun, preferably increases continuously towards the beam exit side.

A connection to the atmosphere which is adjustable by means of a throttle valve and preferably serves to aearate the irradiation chamber and the associated electron beam generator is preferably provided between the beam exit side and the shutter adjacent thereto. However, a permanent dosed supply of a flow medium from the electron beam generator to the irradiation chamber may optionally take place in this way for additionally preventing dust from entering from the material in the irradiation chamber into the electron gun. Radial vacuum generators-are preferably connected between the other shutters. The irradiation chamber preferably has a sufficient length in vertical direction to effect or support the separation of the particles during the free fall of the particulate material or bulk material in said chamber.

The guide plates of the distribution device are preferably arranged in the manner of fans for separating the particulate material or bulk material inside the irradiation chamber (recipient) for dividing the material., or bulk material flow.

Other preferred embodiments of the invention are outlined in the remaining subclaims.

The process and the device of the invention are especially intended for the treatment of seeds as bulk material or particulate material to render ineffective harmful organisms adhering to the seeds. Generally, the process and the device according to the present invention are especially intended to improve the properties of particulate material or bulk material which is moist and/or dusty. As for an efficient treatment of the material with electron beams in vacuum, these accompanying features create special problems with respect to an efficient procedure and a long-term operation of the electron generators that must above all be protected against dust.

Apart from the combat against harmful organisms on seeds, the process and device according to the present invention could also be used for treating granules, catalysts or ceramic bodies for the chemical industry or for other applications.

Materials having relatively disadvantageous properties or a disadvantageous composition for electron beam treatment in vacuum, e.g., a high water and dust content, can also be treated in the process and device of the invention for treating particulate material or bulk material although e.g. dust adhering to the material is above all to be prevented from being released into the irradiation chamber and is to be kept away from the electron beam generators as much as possible. Especially decoupling under vacuum which is carried out during the supply of the material to the irradiation chamber serves to achieve this objective as far as the present invention is concerned.

BRIEF DESCRIPTION OF THE DRAWINGS

The invention shall now be described with reference to an embodiment and accompanying drawings, in which.

DETAILED DESCRIPTION OF THE INVENTION

An embodiment of the invention for the treatment of particulate material (bulk material) shall be explained in the following. The particulate matter in this embodiment is seeds, in particular grains. The invention is of course not limited thereto. Rather, any other organic and/or inorganic material in particulate form that is to be subjected to irradiation with electron beams can be treated as treatment material in the process and in the device of the invention.

Figure 1:
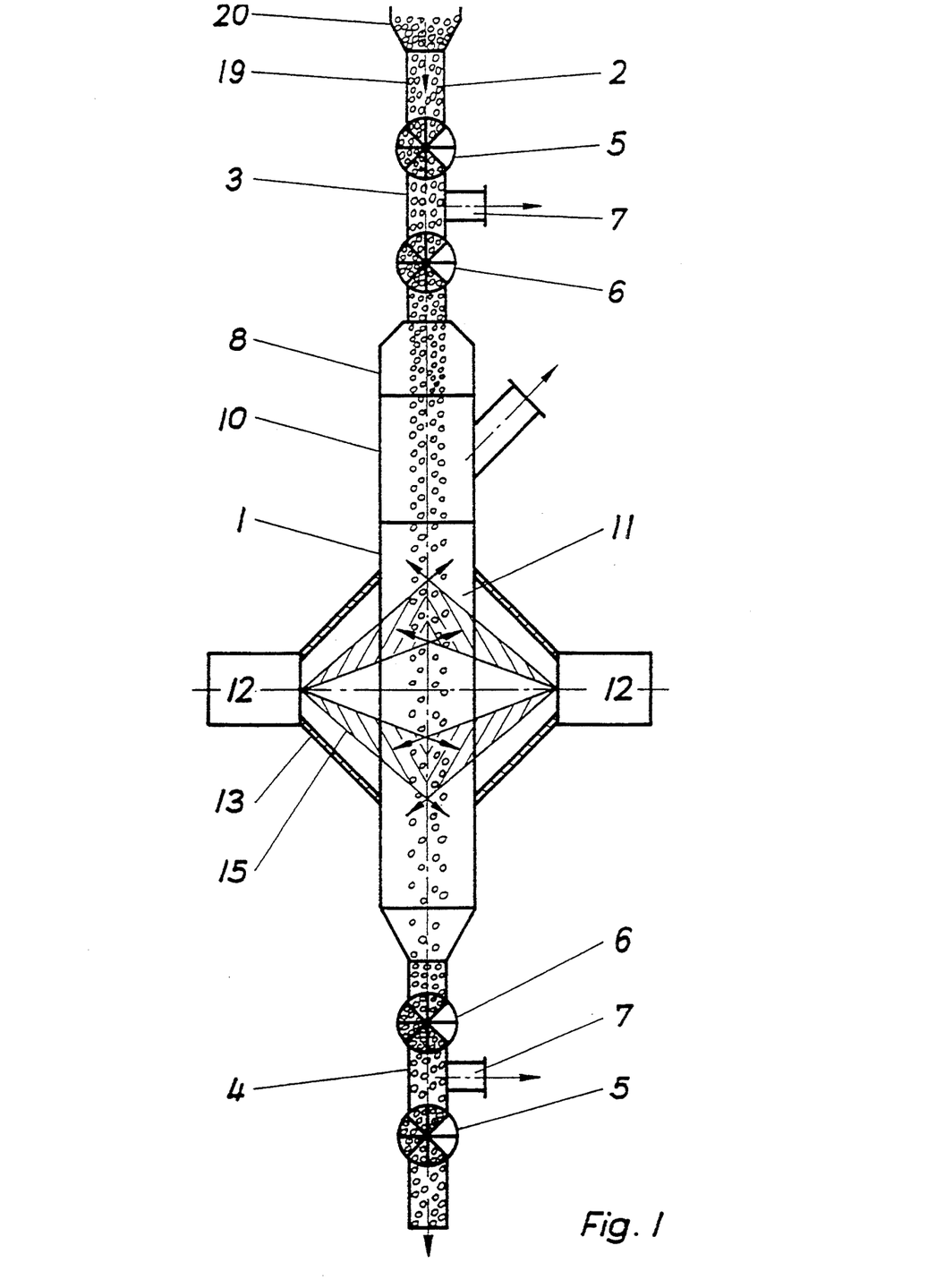
FIG. 1 is a diagrammatic longitudinal and sectional view of a device for treating grains in accordance with the present invention.

FIG. 1 is a diagrammatic longitudinal and sectional view illustrating the procedure as well as the device for treating grains with electron beams.

An irradiation chamber 1 (recipient) is provided with pressure stages 3, 4 for the introduction and discharge and for the formation of a continuous flow of grains 2. Each of these pressure stages consists of two rotary vane feeders 5, 6 and a connection 7 for pressure pumps, in particular vacuum pumps, to build up pressure gradually during the travel of grains 2 towards the evacuated irradiation chamber 1 and to ensure the necessary pressure conditions for possibly another subsequent treatment or discharge of grains 2 after irradiation chamber 1 has been left. A plurality of pressure stages 3, 4 may optionally be arranged one after the other at both the inlet side and the outlet side, especially in response to the pressure difference to be controlled. Grains 2 may be supplied at the inlet side into the device from a silo 20 or another grain supply container.

Figure 2:
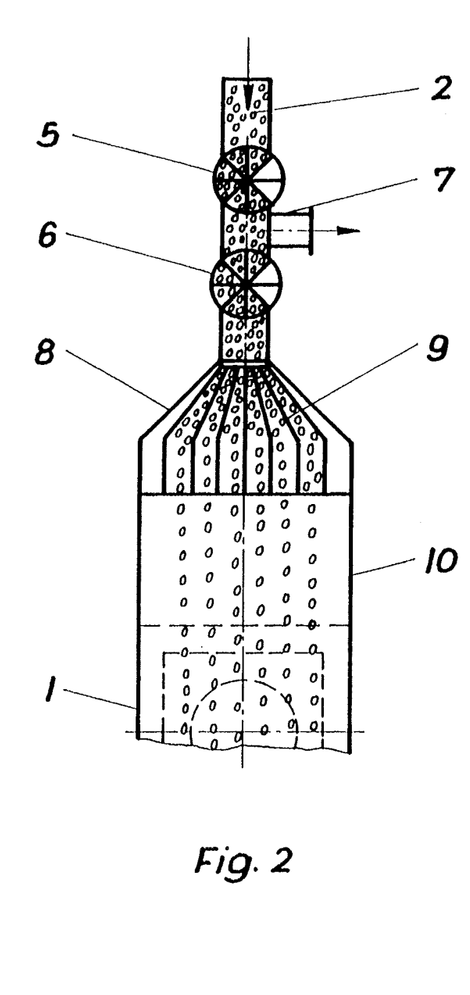
FIG. 2 is a partial view of an upper inlet portion of the device of FIG. 1 in a plane offset by 90° relative to the representation of FIG. 1.

As is especially illustrated in FIG. 2, which shows a transition region between irradiation chamber 1 and the pressure stage at the inlet side for the supply of the material flow of grains 2, a distribution device 8 is provided in a transition region towards irradiation chamber 1 after the preceding pressure stage 3 with rotary vane feeders 5, 6 for separating grains 2. This distribution device 8 includes guide plates 9 arranged in fan-shaped fashion for distributing the flow of grains 2 over a greater cross-sectional area.

The separated grains 2 pass from fall shaft 10, which is arranged downstream of distribution device 8 and already forms part of the evacuated irradiation chamber 1, in a free-fall process into an irradiation field 1! of the evacuated irradiation chamber and fill the cross-section thereof essentially completely at least in the direction of a main plane determined by distribution device 8. The irradiation field is determined by two opposite electron guns 12 flanged via scanner 13. Each grain 2 is irradiated at two sides approximately at the same time owing to the two, diametrically opposite electron guns 12. As a result, grains 2 which rotate during their free fall are irradiated on all sides. On account of the arangement and configuration of the guide plates 9 of distribution device 8, grains 2 have about the same speed and, when passing through irradiation field 11, they are spaced from each other at a distance corresponding at least to the grain size.

Electron guns 12 respectively produce an electron beam 15. Electron beams 15 are spread vertically and horizontally in the plane of projection of FIG. 2 in such a way that they cover the whole cross-section of the material flow of grains 2. The transparency of the bulk material flow of grains 2 which exists in the direction of irradiation due to electron beams 15 is preferably about 50% in irradiation field 11 to avoid a mutual shadowing of grains 2 to a substantial degree. Of course, it is also possible to operate at a higher transparency of the material flow of grains 2. In this case higher power loss portions must be accepted.

Figure 4:
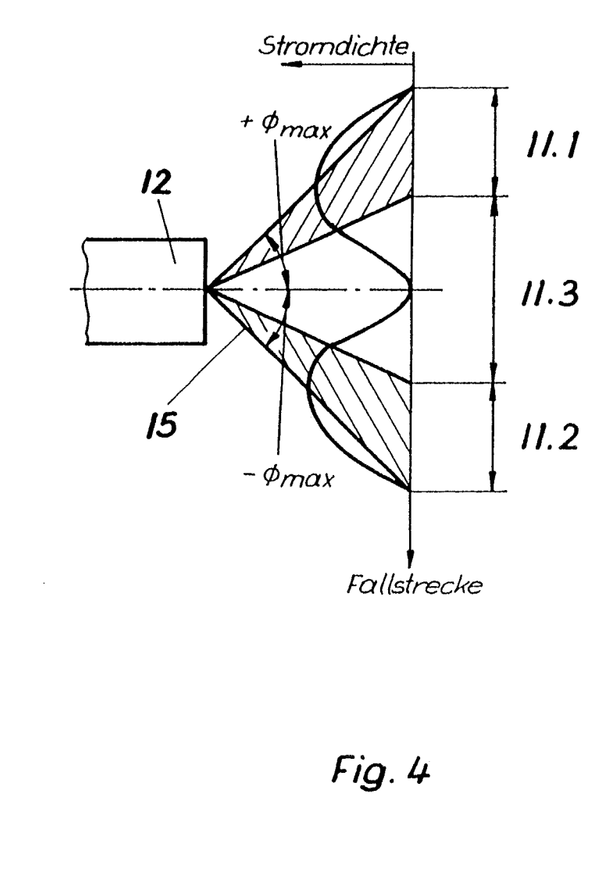
FIG. 4 is a current density profile of an electron beam in the area of an irradiation field of the irradiation chamber.

The deflection functions for the electron beam generators are chosen such that the radiant power is evenly distributed over the width of the bulk material flow and that a current density profile is created in irradiation field 11 in the direction of the falling grains 2, as is shown in FIG. 4. This irradiation field 11 is preferably divided into three regions which follow each other in the direction of fall of the grains and of which two irradiation regions 11.1 and 11.2 have a high current density, said irradiation regions 11.1, 11.2 being separated from each other by an irradiation region 11.3 of a small or disappearing current density. The dose homogeneity is improved over the surface of grains 2 due to the angular scatter of the electrons without any substantial energy loss. To prevent grains 2 from shadowing one another, the distribution of the bulk material flow of grains 2 in irradiation chamber 1 is chosen such that grains 2 move away from one another at such a mean distance that on account of the angle of deflection of an electron beam 15 they are reached at least in one of irradiation fields 11.1 or 11.2 by electron beam 15. A mean distance which corresponds to the grain dimension is required for a vertical deflection angle of 45°. Since the current density is substantially reduced in the center region of irradiation field 11, sensitive components of the oppositely arranged electron guns 12 are not considerably stressed by electron beams 15. The configuration of irradiation field 11 with irradiation fields 11.1 and 11. of a high current density is determined by the deflection function in the vertical and horizontal directions. The line frequency is fixed such that the fall time of the grains through irradiation fields 11.1 and 11.2 is composed of a plurality, e.g. 10, deflection periods. The density of the line raster which is determined by the ratio of line frequency to picture frequency determines the homogeneity of the current density distribution in the direction of the falling grains. In a preferred embodiment, the line frequency of electron beam 15 is respectively chosen such that it is at several kHz, and the picture frequency is preferably within the range of some 10 Hz to some 100 Hz. Electron beam power losses due to a long optical path up to the main plane of the bulk material flow of grains 2 can be compensated through the selection of these parameters of the deflection function, as well as blanking and other influences.

Another advantageous feature regarding the improvement of the homogeneity of the surface dose on the irradiated grains 2 is obtained in that an evacuation pressure of about 10 Pa to some 100 Pa, in particular about 100 Pa to some 100 Pa, is adjusted in irradiation chamber 1, whereby an angular scatter of the accelerated electrons is achieved without any objectionable energy losses.

Figure 3:
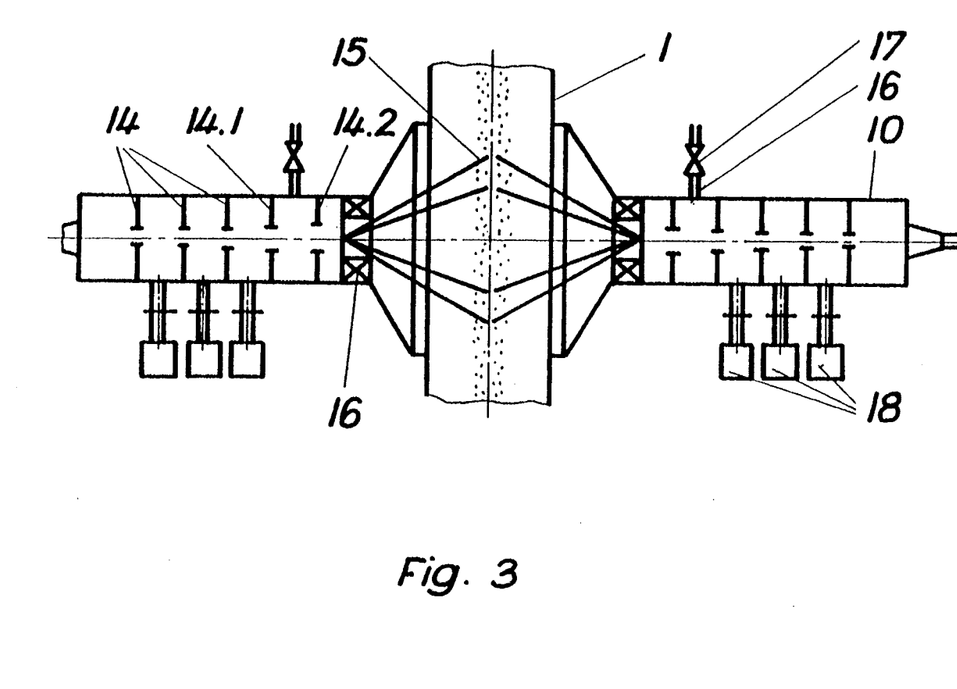
FIG. 3 is a diagrammatic partial view of the device according to FIG. 1 in the area of the irradiation chamber with associated electron beam generators.

As becomes apparent from the partial view of FIG. 3, electron guns 12 respectively have a plurality of shutters 14 arranged in sequential order. The diameter of these shutters constantly increases in the present case in the direction from the beam generator to the exit of electron beam 15. A connection 16 to the atmosphere is provided via valve 17 between the last shutter 14.2 at the exit side and the preceding shutter 14.1. Vacuum generators 18 are respectively connected between the other shutters 14. The penetration of foreign matter, in particular of water vapour and-dust, from the grains in treatment chamber 1 into electron guns 12 can effectively be prevented in this way. Valve 17 serves to aerate the device, with air flows being always directed during pumping and airing away from electron gun 12 towards irradiation chamber 1 or in conjunction with the evacuation process always away from electron gun 12 and irradiation chamber 1 to the side of the atmospheric pressure. Such a connection 16, however, may optionally be used for generating a constant dosed flow of a flow medium from electron gun 12 to irradiation chamber 1 to additionally prevent the penetration of dust into electron gun 12.

After having moved through irradiation region 11 in a free-fall process within the evacuated irradiation chamber 1, grains 2 are discharged at the outlet side from a bottom outlet opening of irradiation chamber 1 through pressure stage 4 with rotary vane feeders 6, 5 under pressure control at connection 7 by means of a vacuum pump or other pressure control devices in response to the pressure desired after the electron beam treatment during the further transport of grains 2.

In response to the treatment conditions, in particular the configuration and control of the cross-sectional distribution of a material flow within irradiation chamber 1 through distribution device 8, it is of course possible to provide another number of electron beam generators in another radial and/or axial arrangement relative to irradiation chamber 1. The only thing of importance is that an irradiation of the individual particles of the material or bulk flow is achieved on all sides together with a surface dose distribution which is as homogeneous possible, namely through the joint action of both the processing of the material or bulk material flow for separating the particles during their fall through the irradiation chamber and the arrangement as well as radial or axial distribution of the electron beam generators the irradiation chamber in consideration of the particles own motion in the material or bulk material flow. With a substantially "disc-shaped" cross-section of the flow of grains 2, as shown in the present embodiment in FIGS. 1 and 2, the arrangement of opposite electron beam generators 12 is sufficient for obtaining a good irradiation result. In response to the configuration of the assembly of the electron beam generator for forming an irradiation field, it is of course also possible to form another current density profile than the one shown in FIG. 4. The adaptation of these parameters depends on the type of the material to be treated, the spatial distribution of the material in the irradiation field, the desired irradiation result and other factors.

Grains 2 can be exposed to electron beams 15 for a sufficiently long time and on all sides due to the opposite arrangement of electron guns 12 according to FIG. 1 and the deflection as well as the wide spreading of electron beams 15 relative to electron guns 12 obliquely upwards and obliquely downwards.

As illustrated, grains 2 are supplied from silo 20 via one or several pressure stages 3 to distribution device 8 and irradiation chamber 1. The pressure at pressure stage 3 or between the individual pressure stages 3 is adjusted by the individual vacuum generators, connected to connections 7 at each pressure stage, in such a way that the vapour pressure of water within the near-surface layer of grains 2 is not fallen below. The evacuation efforts on the whole are minimized for the vacuum generators owing to this pressure adjustment. Rotary vane feeders 6 rapidly transport the bulk material or grains 2 into irradiation chamber 1 in which they move in a free-fall process under a pressure which is determined by the requirements of electron beam 15, acting on the separated grains 2, and which preferably lies between about 100 Pa and some 100 Pa. The stay time of grains 2 in irradiation chamber 1 is very short owing to this conveying principle. As a result, the water discharge from grains 2 as well as evacuation efforts can be kept small. A further reduction of the water vapour discharge is achieved through the sudden temperature reduction which is effected by the rapid transition of the pressure at the last stage of the pressure-stage feeder system at the supply side (pressure stage 3) to the working pressure in irradiation chamber 1. This temperature reduction is limited to the near surface layer of grain 2 because of the relatively great time constant for the temperature compensation in grain 2. The evaporation rate is also reduced on the grain surface owing to this temperature reduction.

The rotary vane feeder 5 at the inlet side is preferably speed-controlled and simultaneously serves as a dosage device. In a line 19 it forms a column of bulk material, here grains 2, upstream of pressures stage 3. This column acts as an additional flow resistance if the length of this column of accumulated grains 2 is large in comparison with the cross-sectional dimensions of said column.

The discharge of grains 2 from irradiation chamber 1 is carried out in an analogous way as the introduction thereof, the respective pressure at the indiviudal pressure stages 4 being also kept above the vapour pressure of the water. The delivery pressure is gradually raised again to atmospheric pressure through pressure stage 4 or a plurality of such stages disposed in series arrangement downstream of irradiation chamber 1. In this case, too, the rotary vane feeders 5, 6 simultaneously serve the dosage of the grain flow. Like in the case of the first rotary vane feeder 5, it is also advantageous to provide a respective line section in front of the last rotary vane feeder 5 at the discharge side, the length of this line section being great in comparison with the cross section thereof so as to form an additional flow resistance at this place, too. Rotary vane feeder 6 which is arranged after irradiation chamber 1 preferably forms a speed-controlled dosage device as well.

In the present embodiment the invention has been described with respect to the electron treatment of a flow of grains for treating the latter against seed-borne harmful organisms. This method and the associated device accomplish an irradiation of the seeds which has a wide fungicidal spectrum of effect without causing any produce-affecting damage. Since the seeds are guided to and away from irradiation chamber 1 via pressure stages in a vacuum-decoupling way, it is possible to keep dust which adheres to the seeds away from the treatment chamber and from the electron beam generators to a substantial degree. Moreover, one achieves a high throughput with reduced dwell times in the irradiation chamber and, despite the high water content of the seeds, considerably increased evacuation efforts are not necessary.

Therefore, the process and the device according to the present invention are especially suited for a continuous treatment of seeds, in particular grain, in a continuous process to combat harmful organisms, without the invention being limited thereto. Rather, other particulate material, granules, small ceramic balls, etc. can be treated for irradiation with electron beams on all sides, and also other types of bulk material, in the inventive process and in the device according to the present invention. The conduction of the evacuation process, the arrangement and distribution, especially, of more than two electron beam generators on the recipient, and the formation of the irradiation field and the selection of the cross-section of the material flow in the irradiation chamber in conjunction with the supply and discharge of the material flow via a pressure-stage feeder system can be modified accordingly in dependence upon the respective treatment task. The invention achieves a considerable improvement of the throughput capacity together with a homogeneous dose distribution over the whole surface of the particulate material or bulk material.

We claim:

1. A device for treating bulk material in particulate form, which comprises electron beams in a vertically arranged irradiation chamber which includes a top inlet opening and a bottom outlet opening for the bulk material having a pressure-stage feeder system connected to a vacuum source for introducing and discharging said bulk material, said pressure stages being composed of a plurality of rotary vane feeders and a distribution device being arranged at an inlet point of said bulk material into said irradiation chamber for separating said material substantially across the whole cross-section of said irradiation chamber, and on which a plurality of electron beam generators are radially arranged, and wherein said irradiation chamber is evacuated, and said electron beam generators are equipped with deflection means for spreading said electron beams to form an irradiation field through which said particulate material exiting from said distributing device is moved in a free-fall process.

2. The device according to claim 1, wherein, said irradiation chamber comprising a fall shaft for said bulk material after said distribution device, at least two electron guns with deflection means for fanning said electron beam being arranged in the area of the free fall of said bulk material within said irradiation chamber radially relative to the flow of bulk material, said electron guns each comprising a plurality of shutters with an opening diameter for said electron beam, a connection for aerating said irradiation chamber via a valve being provided between a shutter closest to the beam exit side and an adjacent shutter, and vacuum generators being respectively arranged between said other shutters of said electron guns.

3. The device according to claim 2, wherein said plurality of shutters have diameters which increase towards the beam exit side of said electron guns and are respectively arranged inside said electron guns.

4. The device according to claim 1, wherein said distribution device has guide plates arranged in the manner of fans.

5. The device according to claim 1, wherein two electron guns are arranged on said irradiation chamber in a diametrically opposite manner at the same level and said irradiation chamber has such an axial length that said bulk material is separated during its free fall in said irradiation field.

6. The device according to claim 1, wherein at least said rotary vane feeder which is acted upon at the inlet side by atmospheric pressure is speed-controlled.

7. The device according to claim 6, wherein said rotary vane feeder for introducing said particulate material or bulk material has a dosage device arranged upstream thereof.

8. The process for treating bulk material in particulate form which comprises the steps of:
 separating said bulk material into dosed amounts at an inlet side of an evacuated irradiation chamber;
 supplying said dosed amounts of the bulk material to said irradiation chamber via at least one pressure stage comprising a plurality of rotary vane feeders connected to a vacuum pump;
 separating said dosed amounts of said bulk material into separate particles through a distribution device being arranged at an inlet point of said bulk material into said irradiation chamber and moving said particles in a continuous free fall process through said evacuated irradiation chamber;
 treating said particles with a plurality of electron beams within an irradiation field in said irradiation chamber by irradiating said particles within said irradiation field on substantially all sides by said electron beams which are spread in the direction of fall of said particles and positioned from several sides and in several different directions;
 and discharging said irradiated particles from said irradiation chamber via at lest one further pressure stage, comprising a plurality of rotary vane feeders connected to a vacuum pump, thereby discharging the treated particulate material in dosed amounts.

9. A process according to claim 8, wherein said particulate material in said irradiation field is acted upon by said electron beams at least partly along a path which begins above the exit point of said electron beam from an electron beam generator and ends below said point.

10. A process according to claim 9, wherein the particles of said material flow pass through said irradiation chamber, in particular said irradiation field, separately at a transparency in the irradiation region of said irradiation field of about 50% and at a mean distance between said particles in a direction transverse to the direction of said material flow which is greater than the particles size.

11. The process according to claim 8, further comprising the step of: adjusting the current density profile of said electron beams in said irradiation field in such a way that the dose of irradiation of the particles passing through said irradiation field and forming said material flow is substantially distributed in a homogeneous way over the surface of said particles.

12. The process according to claim 11, wherein said irradiation field of said electron beams is chosen such that two regions of a high current density that are successive in the flow direction of said material flow and acted upon in a sufficiently uniform way across the cross section of said material flow are separated from each other by a region of reduced current density.

13. The process according to claim 8 further comprising the step of:

supplying a moist or dusty bulk material in particulate form to said pressure stage closest to said irradiation chamber at the inlet side, at a pressure which corresponds to at least the vapor pressure of water on the surface or in the near-surface layers of said particulate material, such that the release of water, gases or dust from said particulate is as small as possible.

14. The process according to claim 13, wherein evacuation products from said particulate material are prevented from flowing into said electron beam generators by controlling the evacuation process in said irradiation chamber and said electron beam generators, preferably gas flows in said irradiation chamber are always bound to flow away from said electron beam generators.

15. The process according to claim 14, wherein air flows are always directed from said electron beam generator and said irradiation chamber to the atmospheric pressure side during evacuation and aeration due to the control of the evacuation process.

16. The process according to claim 8, wherein a pressure of about 10 Pa to some 100 Pa is adjusted in said irradiation chamber.

17. The process according to claim 8, wherein a line frequency of said electron beams is adjusted to several kHz and a picture frequency to about some 10 Hz to some 100 Hz.

* * * * *